(12) United States Patent
Chang

(10) Patent No.: US 8,842,437 B2
(45) Date of Patent: Sep. 23, 2014

(54) COMBINATIONAL CHASSIS FEATURING HEAT DISSIPATION

(76) Inventor: Lerng-Horng Chang, Taipei (TW)

( * ) Notice: Subject to any disclaimer, the term of this patent is extended or adjusted under 35 U.S.C. 154(b) by 282 days.

(21) Appl. No.: 13/551,843

(22) Filed: Jul. 18, 2012

(65) Prior Publication Data

US 2013/0328466 A1 Dec. 12, 2013

(30) Foreign Application Priority Data

Jun. 8, 2012 (TW) .............................. 101211121 U

(51) Int. Cl.
*H05K 7/20* (2006.01)

(52) U.S. Cl.
USPC ...... 361/720; 361/679.54; 361/703; 361/704; 361/709; 361/710; 361/719; 165/185; 174/520; 174/548; 220/4.02; 220/4.24; 220/4.26

(58) Field of Classification Search
USPC ............ 361/679.54, 697, 703–704, 709–710, 361/719–720; 165/185; 174/520, 547–548; 220/4.02, 4.24, 4.26
See application file for complete search history.

(56) References Cited

U.S. PATENT DOCUMENTS

| | | | | |
|---|---|---|---|---|
| 4,111,328 A | * | 9/1978 | Eggert et al. | 220/4.01 |
| 4,791,531 A | * | 12/1988 | Jessup | 361/736 |
| 5,742,478 A | * | 4/1998 | Wu | 361/704 |
| 5,930,116 A | * | 7/1999 | Palmer | 361/704 |
| 6,046,908 A | * | 4/2000 | Feng | 361/707 |
| 6,144,556 A | * | 11/2000 | Lanclos | 361/695 |
| 6,411,514 B1 | * | 6/2002 | Hussaini | 361/704 |
| 6,864,573 B2 | * | 3/2005 | Robertson et al. | 257/718 |
| 7,242,574 B2 | * | 7/2007 | Sullivan | 361/679.21 |
| 7,359,203 B2 | * | 4/2008 | Chen | 361/714 |
| 7,414,838 B2 | | 8/2008 | Yeh | |
| 8,009,431 B2 | * | 8/2011 | Sun et al. | 361/727 |

FOREIGN PATENT DOCUMENTS

| | | | | | |
|---|---|---|---|---|---|
| CN | 201846551 U | * | 5/2011 | | H05K 5/02 |
| FR | 2650473 A1 | * | 2/1991 | | H05K 5/02 |
| KR | 10-0676891 B1 | * | 1/2007 | | H05K 7/20 |
| TW | I302596 | * | 6/1995 | | F28D 15/02 |
| TW | M273035 U | | 8/2005 | | |
| TW | M273767 U | | 8/2005 | | |
| TW | M277978 U | | 10/2005 | | |
| TW | M282241 U | | 12/2005 | | |
| TW | M357184 U1 | * | 5/2009 | | H05K 7/20 |
| TW | M375920 | | 3/2010 | | |
| TW | I323403 B | | 4/2010 | | |
| WO | WO 2007031750 A2 | * | 3/2007 | | H01L 23/40 |

* cited by examiner

*Primary Examiner* — Robert J Hoffberg
(74) *Attorney, Agent, or Firm* — Muncy, Geissler, Olds & Lowe, P.C.

(57) ABSTRACT

A combinational chassis featuring heat dissipation comprises a chassis body, a base plane shell, and a first side shell and a second side shell, of which the two sides connect to each other in the same direction of the base plane shell. A heat dissipation device comprises a plurality of heat-sink parts on the outside surface of chassis body. The heat-sink part comprises a raised portion integrally connected to the inside, and a joint portion connected to the outside. The raised portion integrally protrudes outwards from the outside surface. The joint portion geometrically protrudes from the raised portion. A wedge groove is formed near the joint portions where an inlet groove is formed. The inlet groove connects and communicates with the wedge groove. The chassis may be connected vertically in stack and/or connected horizontally for expansion to expand the computer system for preferably flexible application and optimal heat dissipation.

20 Claims, 11 Drawing Sheets

COMBINATIONAL CHASSIS FEATURING HEAT DISSIPATION

BACKGROUND OF THE INVENTION

1. Field of the Invention

This invention relates to a combinational chassis featuring heat dissipation, which is designed for perfect combination space allocation, easy heat dissipation, and enhancement of the combined space utilization.

2. Description of the Related Art

Existing electronic equipment often have high-performance components or devices to work with and thus features heat dissipation; for example, important components installed in a computer, such as central processing unit (CPU), north and south bridge chips, hard drives and the like will produce heat when operating, and if the temperature of the component is too high, it will affect the performance of computer and will cause the computer to shutdown or impair the computer's service life. Accordingly, cooling measures are very important. The heat produced by the computer device is dissipated normally by a fan. However, some particular computer systems are not provided with the fans, such as PC barebones that features proper heat dissipation instead of fan installation for simplifying the physical volume and space of the computer. Thus, the design of computer chassis for heat dissipation is very important. The related prior art of computer chassis featuring heat dissipation is disclosed in Taiwan Patent Nos. I323403, M273035, M273767, M277978, and M282241.

The disclosed prior art is used for providing the outside of chassis with raised heat-dissipation fins for achievement of heat dissipation. However, to achieve the function of heat dissipation, the heat-dissipation fin must be definitely long, which makes the sharp fin rising outside the chassis easily conected and scratched and seriously affects the appearance and quality of the chassis; thus it is not an ideal design. Further, for example, in Taiwan Patent No M375920, thick indent heat-dissipation fins are provided, as shown in FIG. 4, and the chassis of which the surface is slightly flat is formed, which, however, consumes the internal space of chassis and does not features the efficiency of space availability and is difficult to meet the demand for thin, light weight design; it is thereby not an ideal design.

The heat-dissipation fins designed for the chassis in the art mentioned above are provided functioning for heat dissipation only. The heat-dissipation chassis may further be connected vertically in stack or connected horizontally for expansion to expand the computer system structure, which is very important for the flexible configuration and expansion of industrial computers and cloud computing systems. Obviously, the heat-dissipation chassis in the technology is still limited and should be improved. Thus, how to improve such a lack of heat-dissipation chassis is the issue the industry should strive to resolve.

Owing to the disadvantage of conventional heat-dissipation chassis in use, and the fact that the structure is not ideal, this inventor designs and develops the combinational and expansible heat-dissipation chassis featuring space utilization, small physical volume, and optimal heat dissipation, serving the community and promoting the development of this industry.

Consequently, because of the technical defects of described above, the applicant keeps on carving unflaggingly through wholehearted experience and research to develop the present invention, which can effectively improve the defects described above.

SUMMARY OF THE INVENTION

This invention is mainly to provide a combinational chassis featuring heat dissipation well functioning in a space of smaller physical volume. Further, with the optimal space allocation, it is made to feature optimal effect of heat dissipation and increasing space utilization. The heat-dissipation chassis featuring heat dissipation is connected vertically in stack and/or connected horizontally for expansion to expand the computer system structure for preferably flexible application.

In order to achieve the object mentioned above, the means applied comprises: a chassis body and a heat-dissipation device. The chassis body comprises a base plane shell, and a first side shell and a second side shell, of which the two sides are connected to each other in the same direction of the base plane shell. The chassis body is formed with an outside surface and an inside surface. The free ends of The first side shell and second side shell are formed respectively with a first end joint and a second end joint. The heat dissipation device comprises a plurality of heat-sink parts deposited on the outside surface of chassis body. The heat-sink part comprises a raised portion integrally connected to the inside, and a joint portion connected to the outside. The raised portion integrally protrudes outwards from the outside surface. The joint portion geometrically protrudes from the raised portion and is made, including an end opposite to the raised portion, to be adjacent to the raised portion, thereby a wedge groove being formed. Adjacent to the joint portions, an inlet groove is formed. The inlet groove connects and communicates with the wedge groove. Further, the joint portion and the raised portion are wedged respectively to the wedge groove and the inlet groove.

In order to let you further know the features and technical means of this invention, refer to the following detailed description according to this invention accompanied with drawings; however, the accompanied drawings are provided for reference and illustration only and are not limited to this invention.

DETAILED DESCRIPTION OF THE PREFERRED EMBODIMENTS

Now, the present invention will be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
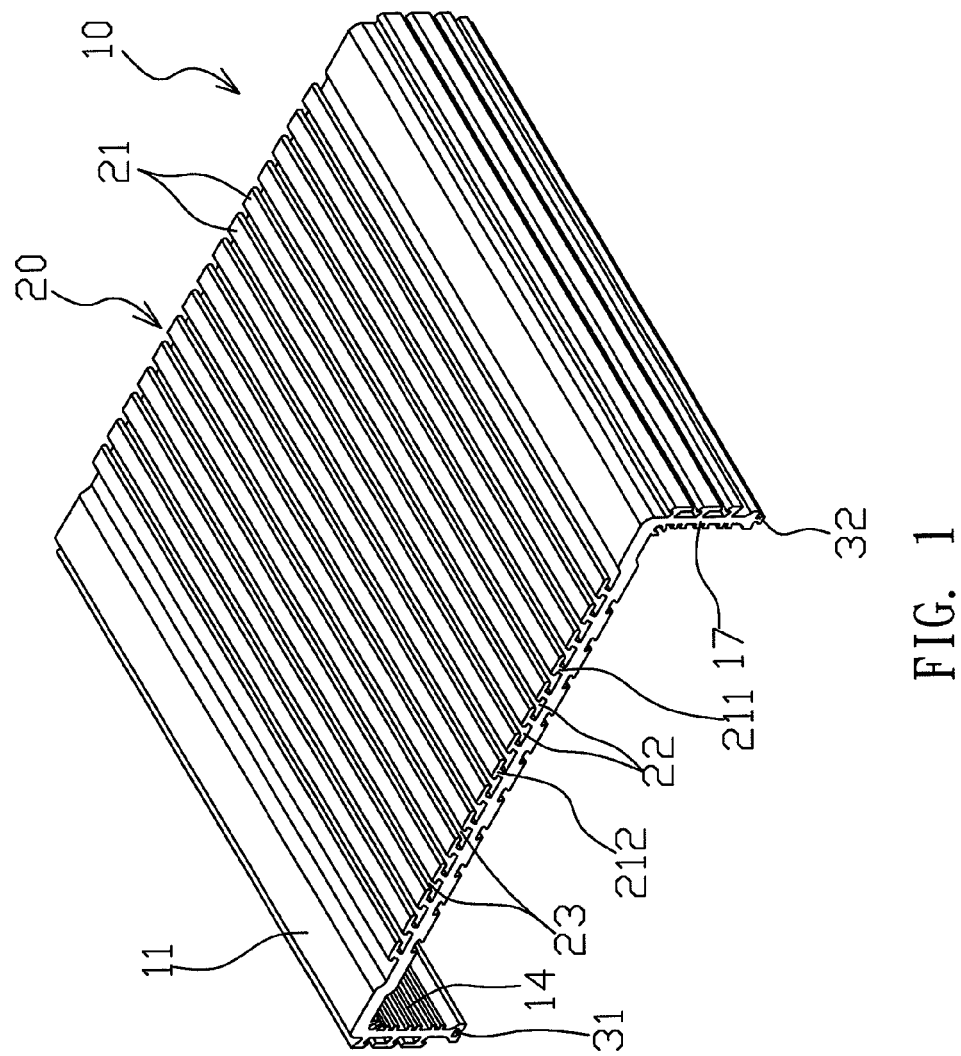
FIG. 1 is a 3D view of the structure.
Figure 2:
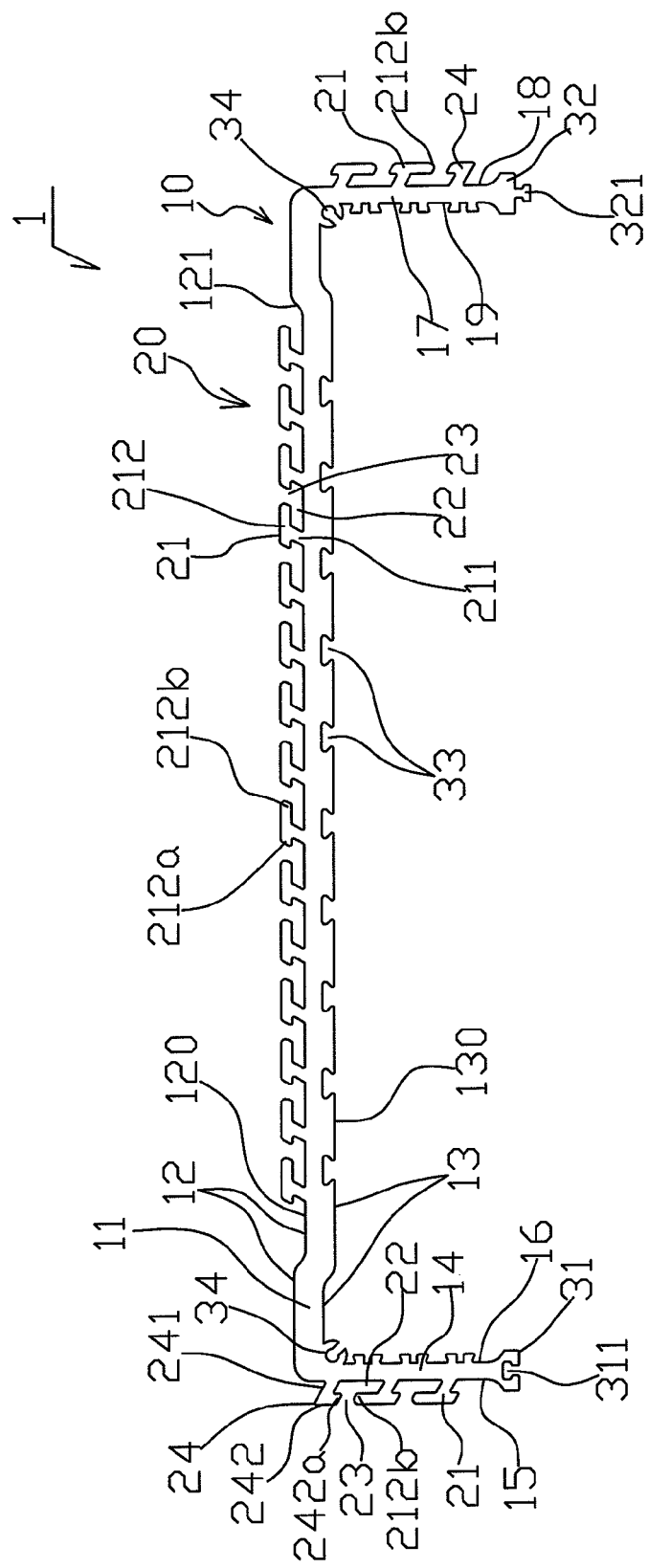
FIG. 2 is a front view.
Figure 3:
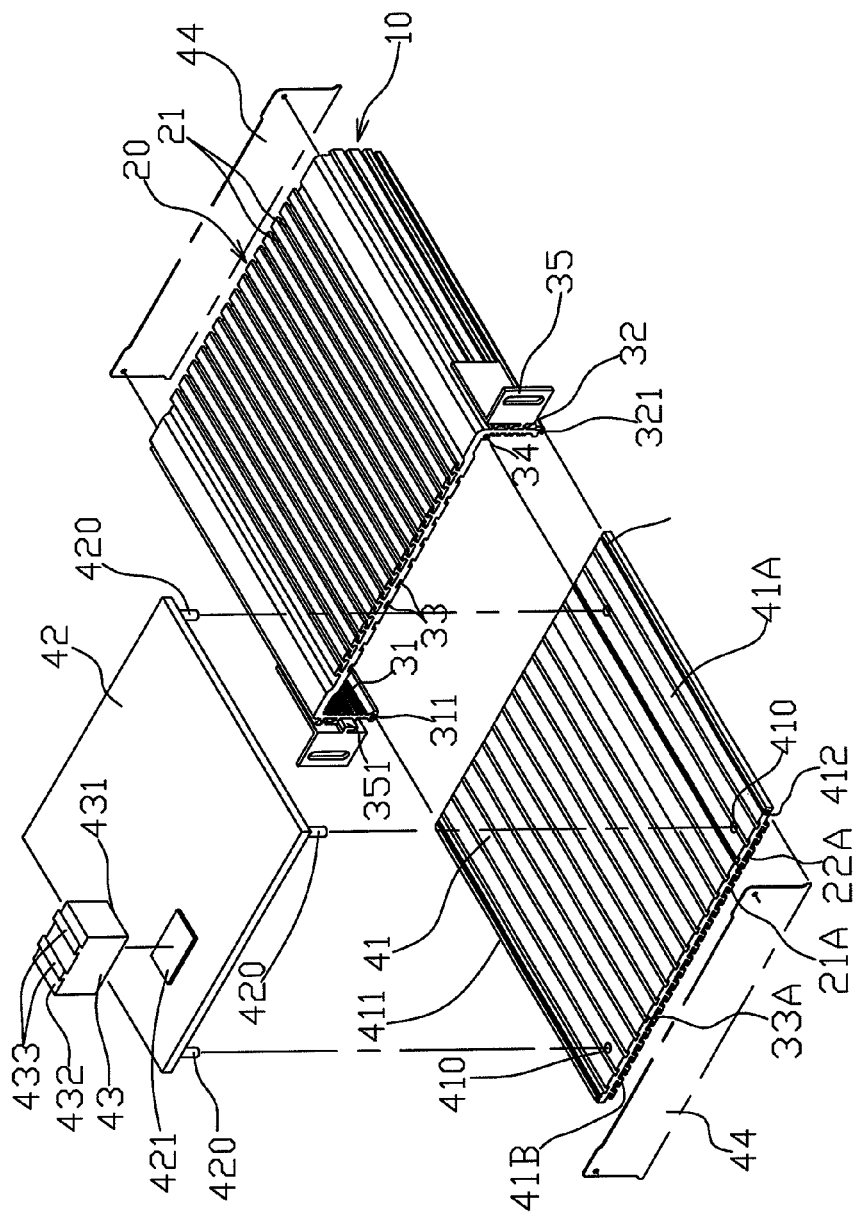
FIG. 3 is an assembly view.

With reference to FIGS. 1 and 3, the combinational chassis 1 featuring heat dissipation according to this invention comprises a chassis body 10 and a heat dissipation device 20. The chassis body 10 comprises a base plane shell 11, and a first side shell 14 and a second side shell 17, of which the two sides are connected to each other in the same direction of the base plane shell 11. The base plane shell 11 is formed with an outside surface 12 and an inside surface 13. The internal surface 13 is further formed with a dovetail-shaped wedge slot 33, implemented in this embodiment but may also be implemented in another shape by those who are skilled in the art. Most of the area of the center of external surface 12 may be further formed into an outer concave surface 120; most of the area of the center of internal surface 13 may also be further relatively formed into an inner convex surface 130. The end side of outer concave surface 120 is connected via a slanted raised surface 121 to the outer surface 12. When the base plane shell 11 is formed with the internal raised surface 130, the plurality of dovetail-shaped wedge slots 33 may be provided on the internal raised surface 130. If the internal surface 13 is not formed with the internal raised surface 130, the plurality of dovetail-shaped wedge slots 33 are provided on the raised surface 13; namely, the disposal of the plurality of dovetail-shaped wedge slots 33 is not limited to the internal raised surface 130. The first side shell 14 is formed with an outside surface 15 and an inside surface 16. The second side shell 17 is formed with an outside surface 18 and an inside surface 19. The free ends of the first side shell 14 and second side shell 17 are formed respectively with a first end joint 31 and a second end joint 32. The first end joint 31 is formed with a first joint groove 311, while the second end joint 32 is formed with a joint protruding portion 321. The joint groove 311 and the joint protruding portion 321 may be wedged to each other and may be changed for the position. The internal surfaces where the base plane shell 11, the first side shell 14, and the second side shell 17 are connected are respectively formed with a retaining rib slot 34. The external surfaces 12, 15, and 18 are the external surfaces of the chassis body 10, while the internal surfaces 13, 16, and 19 are the internal surfaces of the chassis body 10. In a proper means, the base plane shell 11, the first side shell 14, and the second side shell 17 are the heat-sink material and made all in one and are arranged in the U shape, not limited to any orientation.

The heat dissipation device 20 comprises a plurality of heat-sink parts 21 that are provided respectively on the external surface 12 of base plane shell 11, the external surface 15 of first side shell 14, and the external surface 18 of second side shell 17. The plurality of heat-sink parts 21 provided on the external surface 12, also same as the external surfaces 15 and 18, is described below. The heat-sink part 21 comprises a raised portion 211 connected to the inside, and a joint portion 212 connected to the outside. The raised portion 211 may be formed into a rod or a tab. The joint portion 212 may be randomly geometrical. The raised portion 211 integrally protrudes outwards from the outside surface 12. The joint portion 212 protrudes from the raised portion 211, which is horizontal to the external surface 12 and is thus integrally connected to the raised portion 211, and is inclusively made to be opposite to one end (first end 212a) and the other end (second end 212b) of the raised portion 211. In the preferable embodiment, the second end 212b is longer than the first end 212a. The raised portion 211 and the external surface 12 are slanted. Further, adjacent to the raised portion 211, a wedge groove 22 is formed, while adjacent to the joint portions 212 (or the second end 212b and the first end 212a), an inlet groove 23 is formed. The inlet groove 23 connects and communicates with the wedge groove 22; that is, adjacent to the heat-sink part 21, a wedge groove 22 inside and an inlet groove 23 outside are formed. Further, the joint portion 212 and the raised portion 211 are wedged respectively to the wedge groove 2 and the inlet groove 23. Further, when the base plane shell 11 is formed with an external concave surface 120, the plurality of heat-sink parts 21 may be deposited on the external concave surface 120. If the external surface 12 has no the external concave surface 120, the plurality of heat-sink parts 21 are deposited on the external concave surface 12.

The plurality of heat-sink parts 21 deposited on the external surfaces 15 and 18 are likewise deposited on the external surface 12, thereby unnecessary details being not given here. The heat-dissipation device 20 provided on the external surfaces 15 and 18 may further comprises an end heat-sink part 24. The heat-sink part 24 is relatively deposited at one end side of the second end 212b of the heat-sink part 21. The end heat-sink part 24 comprises a raised portion 241 connected to the inside, and a joint portion 242 connected to the outside. The end raised portion 241 may be formed into a rod or a tab. The end joint portion 242 may be adequately geometrical. The end raised portion 241 integrally protrudes outwards from the outside surface 15 or 18. The end raised portion 241 and the raised portion 211 are deposited in a inclined angle. The end joint portion 242 is horizontal to the external surface 15 or 18 and is integrally connected to the raised portion 241. A first end 242a protrudes from one end of the end joint portion, adjacent to the second end 212b, and a wedge groove 22 is formed between the raised portion 211 and the end raised portion 241 that are adjacent to each other. The inlet groove 23, adjacent to the heat sink part 21, is formed adjacently between the joint portions 212 and the end joint portion 242 (or the first end portion 242a and the first end 212a). Between the heat-sink parts 24, a wedge groove 22 inside and an inlet groove 23 outside are likewise formed. Further, the raised portion 241 formed on the external surface 15, the raised portion 211, and the raised portion 241 on the external surface 18, and the raised portion 211 are deposited in a reverse inclined angle. Thus, the upper-end heat-sink parts 24 respectively deposited on the external surfaces 15 and 18 is also arranged in a reverse position. In the preferable embodiment, the heat dissipation device 20 according to this invention is all in one formed on the chassis body 10.

Figure 4:
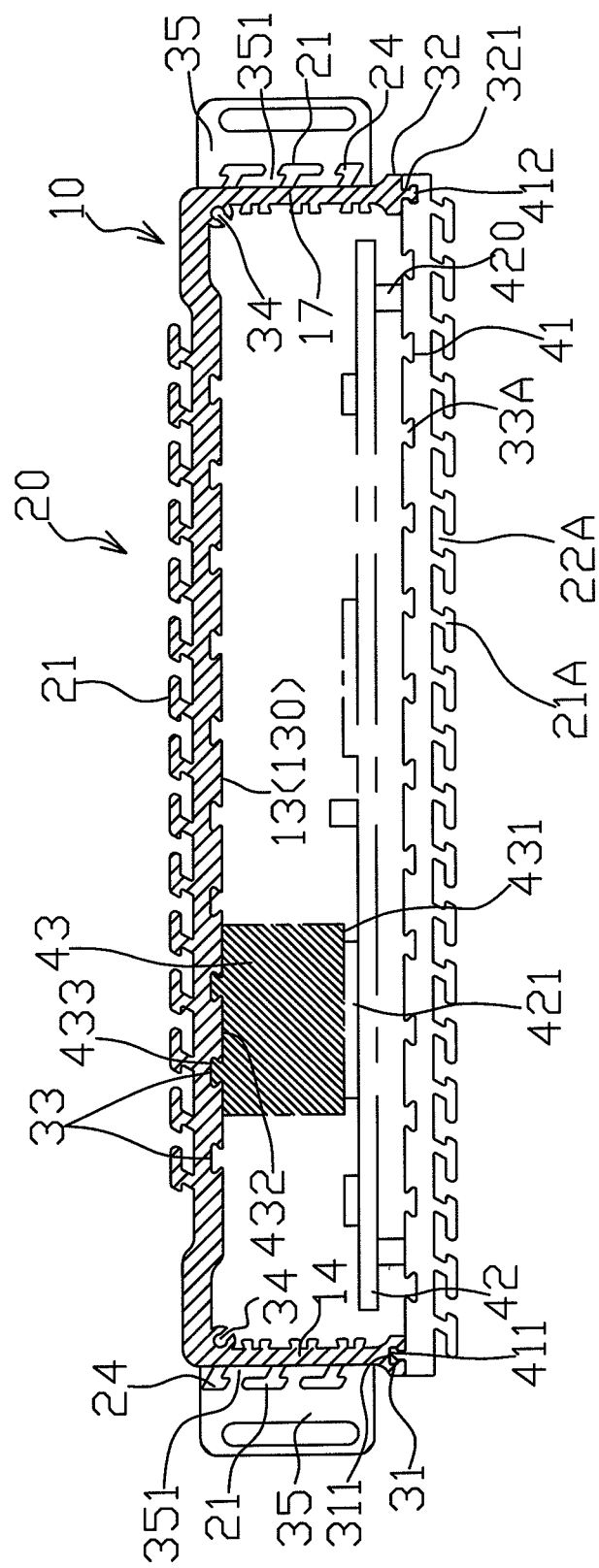
FIG. 4 is a sectional assembly view.

With reference to FIG. 3 and FIG. 4, the combinational chassis featuring heat dissipation according to this invention further comprises an undercut plate 41 and two-side shells 44. The two sides of the undercut plate 41 are formed respectively with a bottom-engaging protruding portion 411 and a bottom-engaging groove 412. The bottom-engaging protruding portion 411 and the bottom-engaging groove 412 are wedged respectively to an end-engaging groove 311 and an end-engaging protruding portion 321 for making the undercut plate 41 combine with the chassis body 10. An internal surface 41A of the undercut plate 41 is formed with a plurality of dovetail wedge grooves 33A. An external surface 41B of the undercut plate 41 is likewise formed with a plurality of heat-sink parts 21A and a wedge groove 22A, same as the heat dissipation device 20. Side-slot holes 410 are formed around the undercut plate 41. The side shell 44 is spirally fixed to the retaining rib slot 34 of the chassis body 10. Further, a circuit board 42 is deposited on the undercut plate 41. The circuit board 42 is retained by inserting end posts 420 into the side-slot holes 410 of the undercut plate 41. On the circuit board 42, a heating part 421, such as a CPU, a chip and the like, are deposited. A heat-conductive part 43 has a heat absorbance side 431 and a heat extraction side 432. The heat absorbance side 431 contacts the heating part 421. On the heat extraction side 432, at least one dovetail wedge bar 433 is deposited. The dovetail wedge bar 433 may be wedged to the dovetail wedge slot 33 of the chassis body 10 so as to make the heat source produced by the heating part 421 pass through the heat-conductive part 43 to the chassis body 10. The heat source is rapidly extracted out of the chassis body 10 through the heat dissipation device 20, heat-sink part 21 and end heat-sink part 24.

Besides, a handle 35 may be provided and wedged onto the external surface 15 of first side shell 14 and the external surface 18 of second side shell 17. On the external surface 15 and a side opposite to the external surface 18, the handle 35 is provided with a wedging part 351 working with the heat-sink part 21 and the end heat-sink part 24 for users' holding for maintenance, as shown in FIG. 3.

In the combinational chassis featuring heat dissipation according to this invention, the heat-sink part 21 is a raised portion 211 that combines with a connecting portion 212, so the heat-sink area is larger and rapid extraction of heat source functions. The connecting portion 212 is deposited horizontal to the external surface of chassis body 10, being likewise provided with a plane surface for safety of use and for chassis' expansion, as described in detail below.

Figure 5:
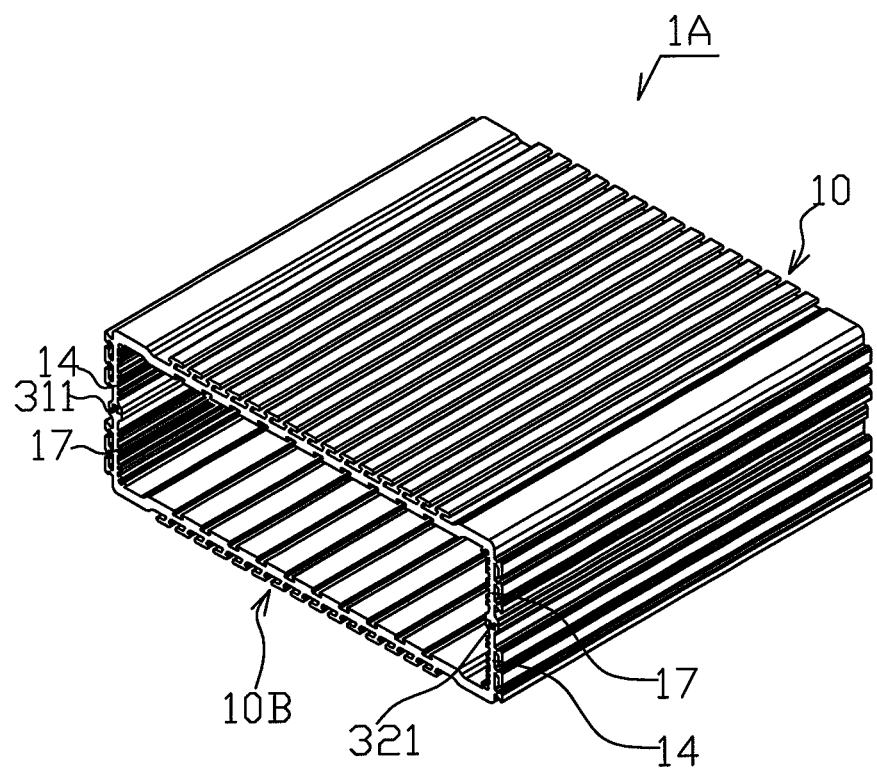
FIG. 5 is an overlap assembly view.

With reference to FIG. 5, the chassis 1A is overlapped and assemble with two chassis bodies 10 and 10B that are deposited reversely and oppositely; namely, the first side shells 14 and second side shells 17 of the two chassis bodies 10 are connected to each other reversely to up and down correspondingly wedge to the end-engaging groove 311 and the end-engaging protruding portion 321, thereby making the chassis body 10 long by 1 U (=1.75 inch) become that long by double 2 U. Accordingly, with the simple assembly, two times of inner space large may achieve, making easy and flexible the expansion of device capacity.

Figure 6:
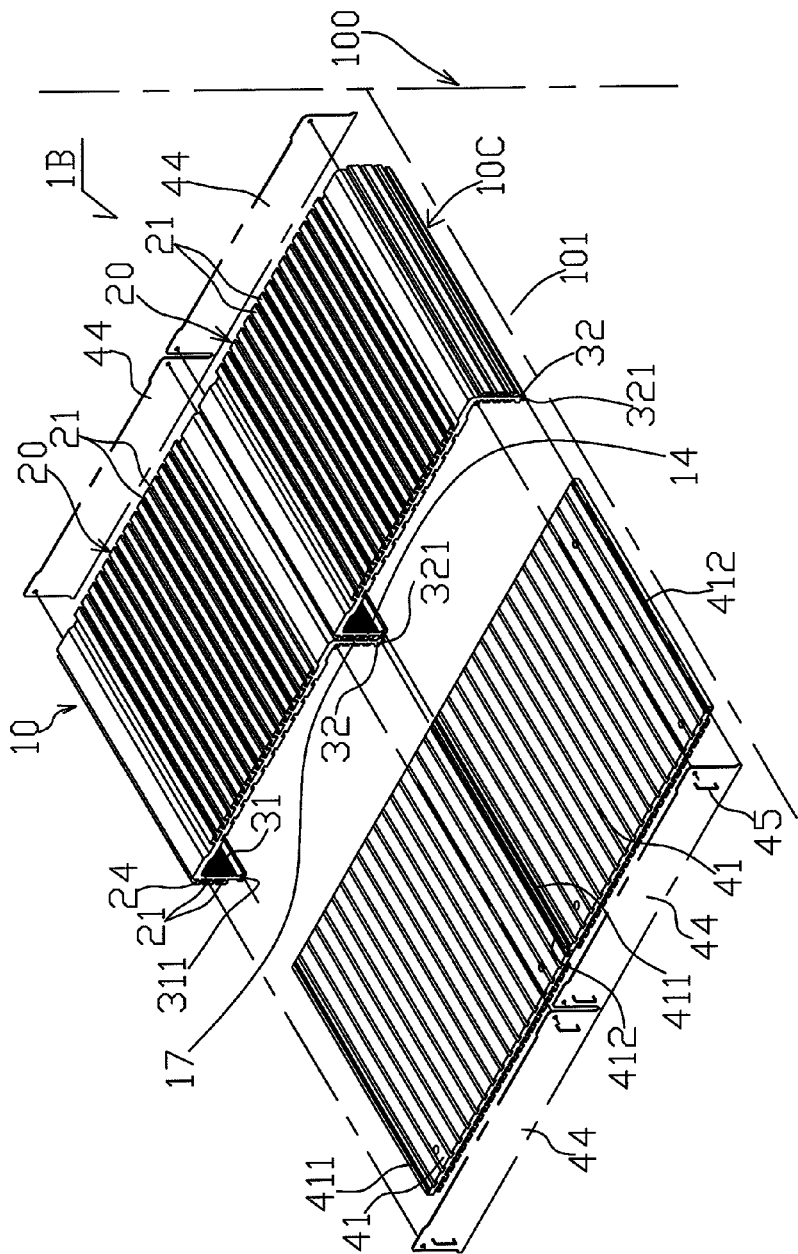
FIG. 6 is a joint assembly view.

With reference to FIG. 6, the chassis 1B is formed by parallel connection with two left and right chassis bodies 10 and 10C that are deposited in parallel; namely, the second side shells 17 and first side shells 14 of the two chassis bodies 10 and 10C are made to wedge to each other to wedge the heat-sink parts 21 (the joint portion 212 and the raised portion 211) in parallel to the wedge groove 22 and the inlet groove 23, thereby making the chassis body 10 wide by 1 L (Length in unit) become that wide by double 2 L (length in unit). Accordingly, with the simple assembly, two times of inner space large may achieve. Likewise, the bottoms and front and rear sides of the chassis bodies 10 and 10C are formed respectively with the undercut plate 41 and the side shell 44, being connected in the same way mentioned above. The side shell 44 may be further formed with the handle 45 for easy extraction and operation. If the chassis 1B is provided on a loader tray of a PC cabinet 100, extraction may be done with the handle 45 for rapid PC assembly or maintenance.

Figure 7:
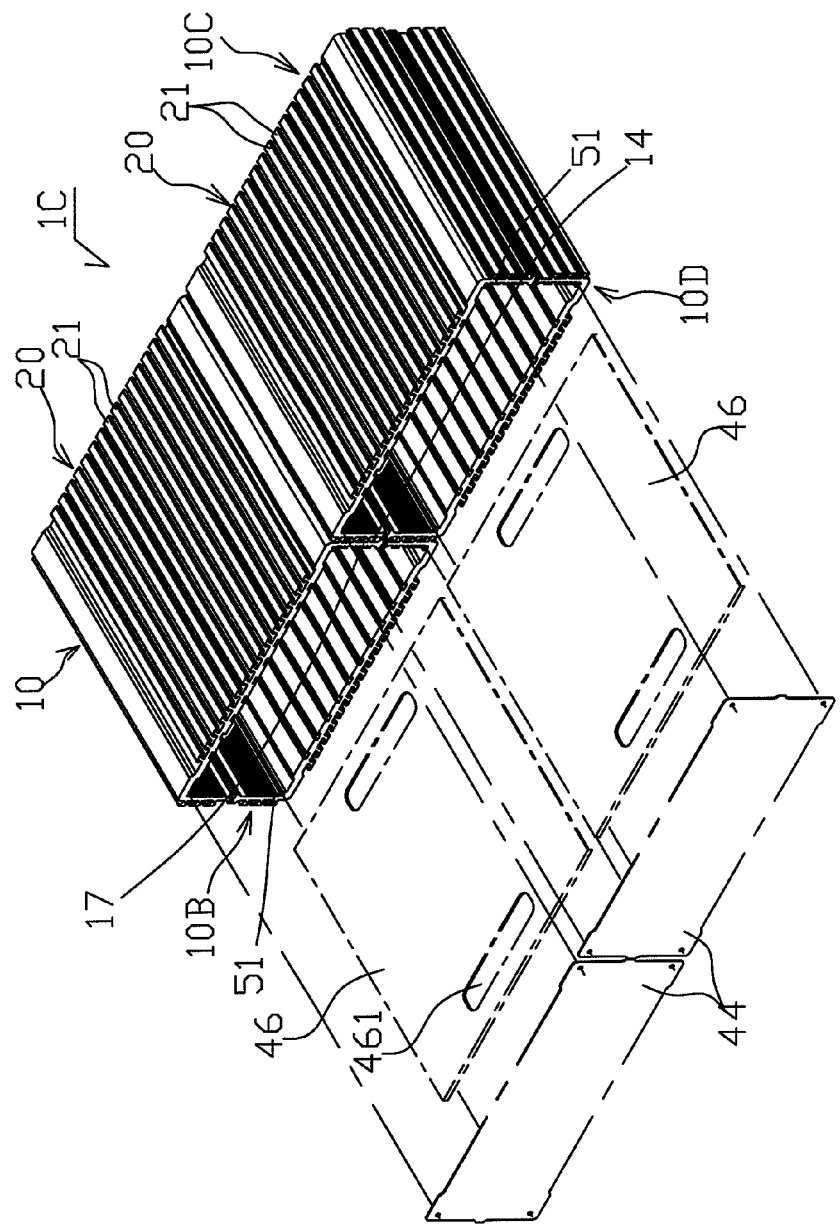
FIG. 7 is a joint-and-overlap assembly view.

With reference to FIG. 7, the chassis 1C is formed by joint-and-overlap assembly with four chassis bodies 10, 10B, 10C, and 10D that are deposited in parallel and overlap up and down and to and fro; namely, the second side shell 17 and the first side shell 14 that are adjacent to each other are connected in parallel to wedge the heat-sink parts 21 (the joint portion 212 and the raised portion 211) to the wedge groove 22 and the inlet groove 23 and thus to wedge to the end-engaging groove 311 and the side-engaging protruding portion 321 by correspondingly overlapping, thereby making the chassis body 10 high and wide by 1 U/1 L (length in unit) become that high and wide by 4 times of 2 U/2 L (length in unit). Accordingly, with the simple assembly, 4 times of inner space large may achieve.

The internal surfaces of the first side shell 14 and second side shell 17 of the chassis body 10 are further formed with a plurality of wedge slots 51. The wedge slot 51 may also be the dovetail wedge slot. The chassis 1C may be provided with a sandwich plate 46. Depending on the height, the sandwich plate 46 wedges and glides securely into the wedge slot 51. The front and rear sides of the sandwich plate 46 are formed with support slots 461. On the sandwich plate 46, a circuit board or another electronic component (not shown) may be deposited. The support slot 461 is formed, through which a bus connecting the circuit board or another electronic component passes to connect to other components on upper and lower layers.

Figure 8:
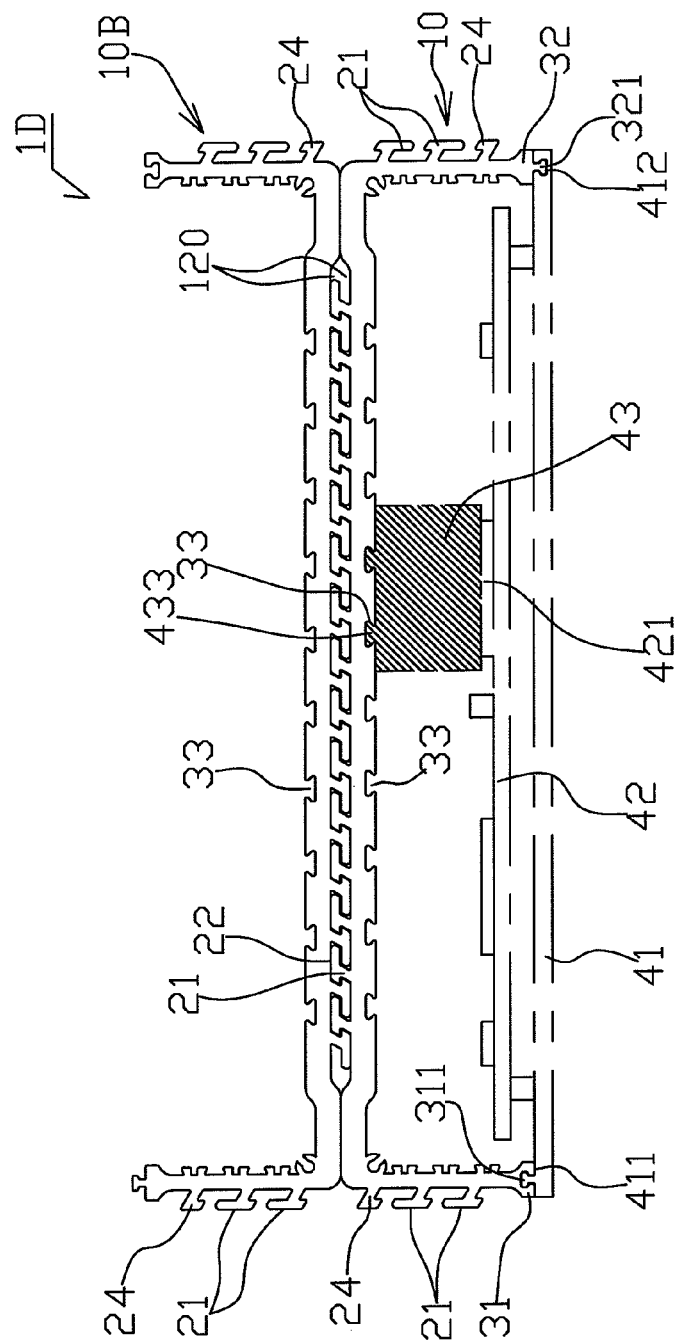
FIG. 8 is back-based overlap assembly view.

With reference to FIG. 8, the chassis 1D is formed in the manner of back-based overlap assembly with two chassis bodies 10B and 10 that are deposited up and down and overlap by backs; namely, the two backs connect to the base plane shell 11 to wedge the heat-sink parts 21 (the joint portion 212 and the raised portion 211) correspondingly to the wedge groove 22 and the inlet groove 23. The side-engaging groove 311 and side-engaging protruding portion 321 of the first side shell 14 and second side shell 17 of the chassis body 10 (10B) may be likewise wedged to the undercut plate 41 for depositing the circuit board 42 and the heating part 421, the heat-conductive part 43 and the like on the circuit board 42, thereby making the chassis body 10 high by 1 U (length in unit) become that high by double 2 U (length in unit). Accordingly, with the simple assembly, making easy and flexible the expansion of internal space capacity achieves.

Figure 9:
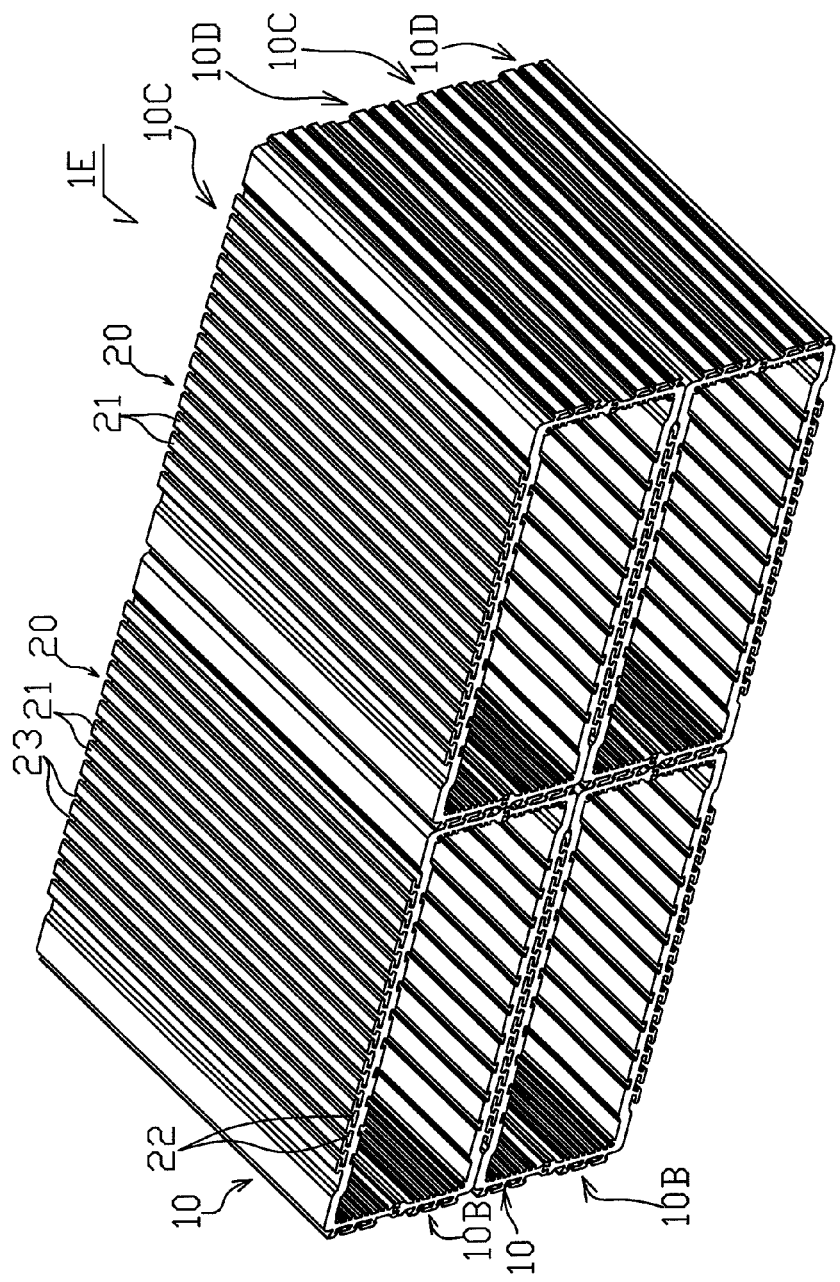
FIG. 9 is an expansive joint-and-overlap assembly view.

Refer to FIG. 9 as an expansive joint-and-overlap assembly view illustrating the chassis 1E based on the joint-and-overlap assembly view of FIG. 7, and the back-based overlap assembly view of FIG. 8, in which a manner of up-and-down expansion is added.

Figure 10:
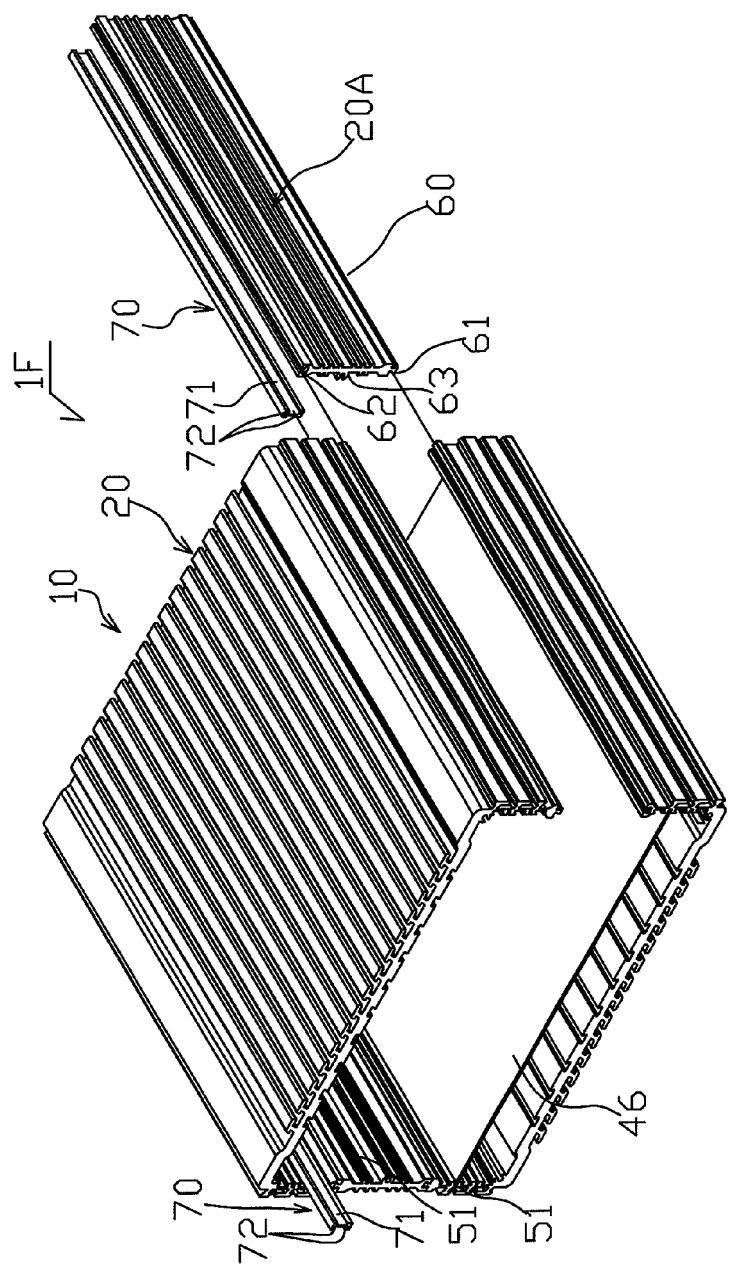
FIG. 10 is an expansive assembly view of the chassis of which a side cut plate is connected.

Refer to FIG. 10 illustrating the chassis 1F that is further formed. The internal surfaces of the first side shell 14 and second side shell 17 of the chassis body 10 are further formed with a plurality of wedge slots 51. The wedge slot 51 may also be the dovetail wedge slot. Thus, depending on the height, the sandwich plate 46 may wedge and glide securely into the wedge slot 51. The side of a side-cut plate 60 is formed separately with the side-engaging protruding portion 61 and the side-engaging groove 62 to respectively wedge to the side-engaging groove 311 and the side-engaging protruding portion 321 of the chassis body 10 (10B), thereby making the chassis body 10 high by 2 U (length in unit) become the chassis 1F high by 3 U (length in unit). Accordingly, with the simple assembly, making easy and flexible the expansion of internal space capacity achieves. The outside of a slide rail 70 is formed with a concave portion 71, thereby two protruding wedge ends 72 being formed. The wedge end 72 may be movably wedged to the wedge slot 51 of the chassis body 10(10B). The concave portion 71 of the slide rail 70 may be connected to the sandwich plate 46; namely, the two sides of sandwich plate 46 is connected to the two slide rails 70. On the sandwich plate 46, a circuit board or another electronic component may be deposited. Thus, the sandwich plate 46 may be easily pulled or pushed by means of the two sides of slide rails 70 for easy maintenance or installation. Further, the concave portion 71 of the slide rail 70 may also be connected a clamping plate in another shape (not shown). The shape of clamping plate is not limited, and regarding the shape, the plate may stretch upwards at the two sides and is then bent and stretch to the center for increasing the height of loading of the electronic parts; namely, the clamping plate may be made in a required shape to satisfy the requirements of loading of different electronic components.

Figure 11:
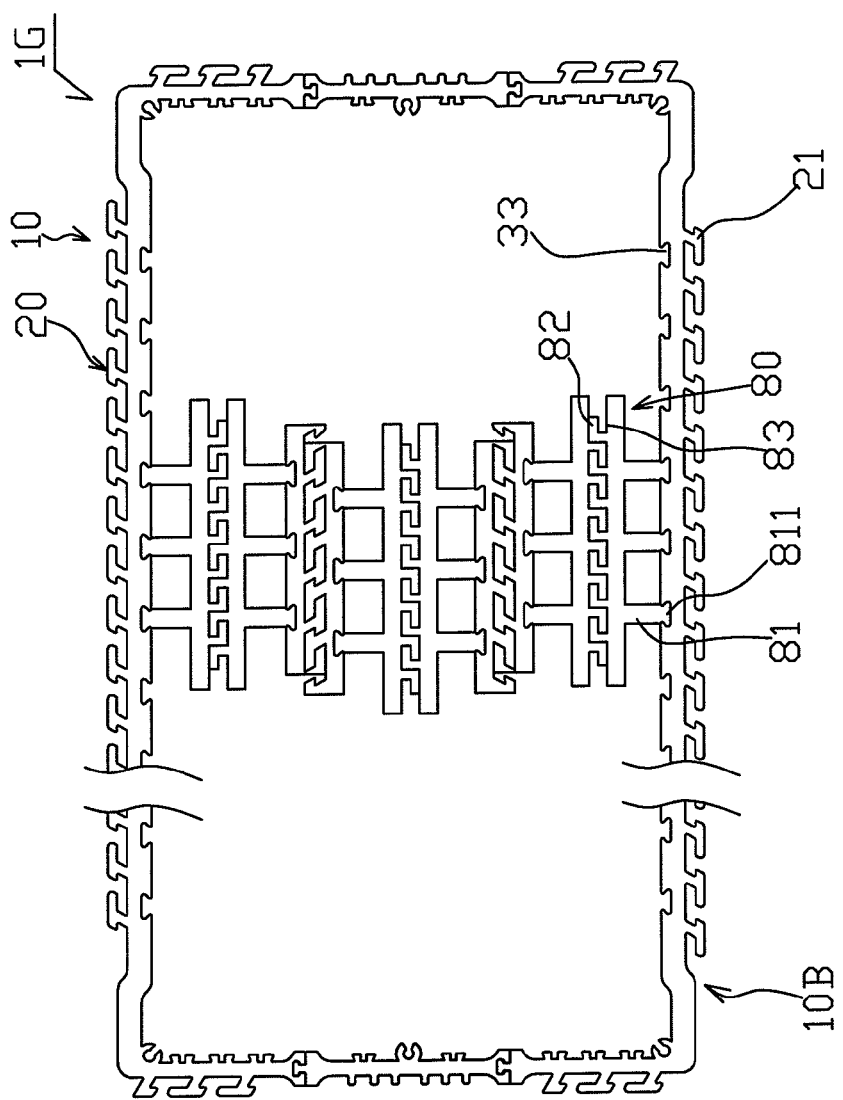
FIG. 11 is an assembly view of heat-sink plates that are connected.

With reference to FIG. 11, the chassis 1G further comprises at least one heat-sink plate 80. One side of the heat-sink plate 80 protrudes with a connecting pillar 81. An end of the connecting pillar 81 is formed with a dovetail end 811. The dovetail end 811 may be relatively wedged to the dovetail wedge slot 33 of the chassis body 10 (10B). The other side of the heat-sink plate 80 is formed with a plurality of heat-sink joint portions 82 and heat-sink grooves 83 that are adjacent to each other. Thus, the heat-sink plate 80 may be implemented for reverse overlap and connection and contact and connect to the upper and lower layers of chassis body 10/10B (chassis 1F) to transmit and extract out the heat source.

The combinational chassis featuring heat dissipation according to this invention is provided for well dissipate the heat produced by the chassis of smaller physical volume, and with the optimal space allocation, better heat dissipation effect and space utilization increasing achieve. Further, the heat-dissipation chassis featuring heat dissipation is connected vertically in stack and/or connected horizontally for expansion to expand the computer system structure for preferably flexible application.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A combinational chassis featuring heat dissipation, comprising: a chassis body, comprising a base plane shell, and a first side shell and a second side shell, of which the first side shell and the second side shell are extending in a same direction from two opposite sides of the base plane shell; the chassis body being formed with an outside surface and an inside surface; a free end of the first side shell being formed with a first end joint and a free end of the second side shell being formed with a second end joint, the first joint end configured to mate with the second joint end of a second one of the chassis body and the second joint end configured to mate with the first joint end of the second one of the chassis body; the base plane shell, the first side shell, and the second side shell being of a heat-sink material and being made all in one; and a heat dissipation device comprising a plurality of heat-sink parts deposited on the outside surface of chassis body, each of the plurality of heat-sink parts being identical to each other; each heat-sink part of the plurality of heat-sink parts comprising a heat-sink raised portion integrally protruding outwards from the outside surface of the chassis body, and a heat-sink joint portion geometrically protruding outwards of the heat-sink raised portion; and being made adjacent to the heat-sink raised portion; a wedge groove formed between the heat-sink raised portion and the heat-sink raised portion of an adjacent heat-sink part of the plurality of heat-sink parts; and an inlet groove connecting and communicating with the wedge groove, the inlet groove formed between the heat-sink joint portion and the heat-sink joint portion of the adjacent heat-sink part of the plurality of heat-sink parts; the heat-sink raised portion and the heat-sink joint portion being configured to wedge respectively to the wedge groove and the inlet groove of a third one of the chassis body.

2. The combinational chassis featuring heat dissipation according to claim 1, wherein a plurality of dovetail-shaped wedge slots are provided on the inside surface of the base plane shell.

3. The combinational chassis featuring heat dissipation according to claim 1, wherein a central area of the outside surface on the base plane shell is formed into an inner convex surface.

4. The combinational chassis featuring heat dissipation according to claim 1, wherein the first end joint of the first side shell of the chassis body is formed with an end joint groove, the second end joint of the second side shell is formed with an end joint protruding portion, the end joint groove of the chassis body configured to be wedged with the end joint protruding portion of the second one of the chassis body, and the end joint protruding portion of the chassis body configured to be wedged with the end joint groove of the second one of the chassis body.

5. The combinational chassis featuring heat dissipation according to claim 4, wherein the second one of the chassis body is reversed to the chassis body and combined in a manner of overlapping, the first side shell of each of the chassis body and the second one of the chassis body and second side shell of the chassis body and the second one of the chassis body are reversely wedged to each other to make the end joint groove of the first end joint of the chassis body wedge to the end joint protruding portion of the second end joint of the second one of the chassis body and the end joint protruding portion of the second end joint of the chassis body wedge to the end joint groove of the first end joint of the second one of the chassis body thereby making the chassis body and the second one of the chassis body double a length of the chassis body.

6. The combinational chassis featuring heat dissipation according to claim 4, wherein the chassis further comprises an undercut plate, two opposing sides of the undercut plate are formed respectively with a bottom-engaging protruding portion and a bottom-engaging groove, the bottom-engaging protruding portion and the bottom-engaging groove are wedged respectively to the end joint groove and the end joint protruding portion for making the undercut plate combine with the chassis body, an internal surface of the undercut plate is formed with a plurality of dovetail wedge grooves, and the external surface of undercut plate is formed with a plurality of undercut plate heat-sink parts and a plurality of undercut plate wedge grooves.

7. The combinational chassis featuring heat dissipation according to claim 6, wherein a plurality of dovetail-shaped wedge slots are provided on the inside surface of the base plane shell, a circuit board is deposited on the undercut plate, at least one heating part is deposited on the circuit board, a heat-conductive part is deposited on the at least one heating part, the heat-conductive part has a heat absorbance side and a heat extraction side, the heat absorbance side contacts the at least one heating part, at least one dovetail wedge bar is deposited on the heat extraction side, the at least one dovetail wedge bar is wedged to respective ones of the plurality of dovetail wedge slots of the base plane shell of the chassis body so as to make heat produced by the at least one heating part pass through the heat-conductive part to the chassis body, and the heat is rapidly extracted out of the chassis body through the heat dissipation device.

8. The combinational chassis featuring heat dissipation according to claim 4, wherein the chassis further comprises a side-cut plate, and two opposing sides of a side-cut plate are formed respectively with a side-engaging protruding portion and a side-engaging groove to respectively wedge to the end joint groove of the first side shell of the chassis body and the end joint protruding portion of the second side shell of the chassis body, increasing a height of the chassis and an expansion of internal space capacity of the chassis.

9. The combinational chassis featuring heat dissipation according to claim 1, the chassis body further comprises a plurality of retaining rib slots, a first slot of the plurality of retaining rib slots formed on the inside surface at a junction of the base plane shell and the first side shell, and a second slot of the plurality of retaining rib slots formed on the inside surface at a junction of the base plane shell and the second side shell.

10. The combinational chassis featuring heat dissipation according to claim 1, wherein a second end of the heat-sink joint portion is longer than a first end of the heat-sink joint portion.

11. The combinational chassis featuring heat dissipation according to claim 1, wherein the heat-sink raised portion and the outside surface are slanted.

12. The combinational chassis featuring heat dissipation according to claim 1, the heat dissipation device further comprises an end heat-sink part, the end heat-sink part deposited on the outside surface of the first side shell of the chassis body, the end heat-sink part is deposited at one end of the plurality of heat-sink parts, the end heat-sink part comprises an end raised portion protruding outwards from the outside surface of the chassis body, and an end joint portion protruding outwards of the end raised portion, the heat-sink raised portion of each heat-sink part and the end raised portion of the end heat-sink part are deposited in an inclined angle, the end joint portion is parallel to the outside surface of the first side shell.

13. The combinational chassis featuring heat dissipation according to claim 12, wherein the end joint portion of the end heat-sink part is adjacent to a second end of the heat-sink joint portion of one of the plurality of heat-sink parts adjacent to the end heat-sink part, the wedge groove formed between the end raised portion of the end heat-sink part and the heat-sink raised portion of the one of the plurality of heat-sink parts adjacent to the end heat-sink part, and the inlet groove formed between the end joint portion of the end heat-sink part and the heat-sink joint portion of the one of the heat-sink parts adjacent to the end heat-sink part.

14. The combinational chassis featuring heat dissipation according to claim 13, wherein the heat-sink raised portion of each heat-sink part and the end raised portion of the end heat-sink part formed on the first side shell are deposited reversely at the inclined angle to the heat-sink raised portion of each heat-sink part formed on the second side shell.

15. The combinational chassis featuring heat dissipation according to claim 14, the heat dissipation device further comprises a second end heat-sink part deposited on the outside surface of the second side shell of the chassis body, the second end heat-sink part arranged in a reverse position to the first end heat-sink part deposited on the first side shell.

16. The combinational chassis featuring heat dissipation according to claim 1, further comprises the third one of the chassis body comprising another heat dissipation device, the heat dissipation device of the chassis body and the another heat dissipation device are connected in parallel to wedge the first side shell of the chassis body and a second side shell of the third one of the chassis body to each other for wedging the heat-sink raised portion of the heat dissipation device into a wedge groove of the another chassis heat dissipation device, the heat-sink joint portion of the heat dissipation device into an inlet portion of the another heat dissipation device, the wedge groove of the heat dissipation device into the heat-sink raised portion of the another heat dissipation device, and the inlet portion of the heat dissipation device into the heat-sink joint portion of the another heat dissipation device, thereby making a width of the chassis body and the third one of the chassis body double a width of the chassis body.

17. The combinational chassis featuring heat dissipation according to claim 1, wherein the inside surface of the first side shell and the inside surface of the second side shell are each formed with a plurality of wedge slots.

18. The combinational chassis featuring heat dissipation according to claim 17, wherein the chassis further comprises a slide rail, an outside of slide rail is formed with a concave portion, thereby forming two protruding wedge ends, and each of the two protruding wedge end is movably wedged to a corresponding one of the plurality of wedge slots of the chassis body for depositing the slide rail on the corresponding one of the plurality of wedge slots of the inside surface of one of the first side shell or second side shell.

19. The combinational chassis featuring heat dissipation according to claim 18, wherein the concave portion of the slide rail is further connected to a sandwich plate, two opposing sides of sandwich plate are connected respectively to the slide rail deposited on the first side shell and a second slide rail deposited on the second side shell, one of a circuit board or another electronic component is deposited on the sandwich plate, the sandwich plate is thereby easily pulled or pushed by means of the slide rail and the second slide rail for easy maintenance or installation.

20. The combinational chassis featuring heat dissipation according to claim 1, wherein the chassis further comprises a plurality of heat-sink plates, one side of a first heat-sink plate of the plurality of heat-sink plates protrudes with a connecting pillar, an end of the connecting pillar is formed with a dovetail end, another side of the first heat-sink plate is formed with a plurality of heat-sink joint portions and a plurality of heat-sink grooves that are adjacent to each other, the first heat-sink plate is implemented for reverse overlap and connection with a second heat-sink plate of the plurality of heat-sink plates, and the dovetail end of the connecting pillar the first heat-sink plate contacts and connects to the base plane shell of chassis body to transmit and extract heat out of a heat source.

* * * * *